(12) United States Patent
Dang et al.

(10) Patent No.: US 8,026,734 B2
(45) Date of Patent: Sep. 27, 2011

(54) DUAL TIP TEST PROBE ASSEMBLY

(75) Inventors: Son Ngoc Dang, Gilbert, AZ (US); John McCormick, Tyrone, GA (US); Habib Kilicaslan, Chandler, AZ (US)

(73) Assignee: SV Probe Pte. Ltd., Singapore (SG)

( * ) Notice: Subject to any disclaimer, the term of this patent is extended or adjusted under 35 U.S.C. 154(b) by 38 days.

(21) Appl. No.: 12/490,624

(22) Filed: Jun. 24, 2009

(65) Prior Publication Data

US 2010/0327894 A1    Dec. 30, 2010

(51) Int. Cl.
*G01R 1/067* (2006.01)
*G01R 31/00* (2006.01)

(52) U.S. Cl. .......... 324/755.01; 324/755.07; 324/755.11

(58) Field of Classification Search .................. None
See application file for complete search history.

(56) References Cited

U.S. PATENT DOCUMENTS

| | | | | | |
|---|---|---|---|---|---|
| 4,423,373 | A | * | 12/1983 | LeCroy, Jr. | 324/72.5 |
| 4,480,223 | A | * | 10/1984 | Aigo | 324/752 |
| 6,529,024 | B2 | * | 3/2003 | Noda | 324/754 |
| 2005/0162177 | A1 | * | 7/2005 | Chou | 324/754 |

* cited by examiner

*Primary Examiner* — Minh N Tang
(74) *Attorney, Agent, or Firm* — Hickman Palermo Truong & Becker LLP; Edward A. Becker (57) ABSTRACT

A dual tip test probe assembly for use in both cantilever and vertical probe applications includes first and second elongated test probes, each having a body portion and a tip portion with a tip configured to make contact with a device under test. An electrically-insulating material is disposed between but not in contact with the body portions of the first and second elongated test probes to electrically isolate the first and second elongated test probes. The first and second elongated test probes are held in alignment with respect to each other so that the tip of the first elongated test probe is adjacent to and not in contact with the tip of the second elongated test probe for making simultaneous contact with the device under test. The dual tip test probe assembly provides a low inductance and a small, stable footprint for testing small and/or non-flat test points.

15 Claims, 10 Drawing Sheets

DUAL TIP TEST PROBE ASSEMBLY

FIELD OF THE INVENTION

This invention relates generally to integrated circuit testing using probe cards.

BACKGROUND

The approaches described in this section are approaches that could be pursued, but not necessarily approaches that have been previously conceived or pursued. Therefore, unless otherwise indicated, the approaches described in this section may not be prior art to the claims in this application and are not admitted to be prior art by inclusion in this section.

In semiconductor integrated circuit manufacturing, it is conventional to test integrated circuits ("IC's") during manufacturing and prior to shipment to ensure proper operation. Wafer testing is a well-known testing technique commonly used in production testing of wafer-mounted semiconductor IC's, wherein a temporary electrical connection is established between automatic test equipment (ATE) and each IC formed on the wafer to demonstrate proper performance of the IC's. Components that may be used in wafer testing include an ATE test board, which is a multilayer printed circuit board that is connected to the ATE, and that transfers the test signals between the ATE and a probe card assembly. The probe test card assembly (or probe card) includes a printed circuit board that generally contains several hundred probe needles (or "probes") positioned to establish electrical contact with a series of connection terminals (or "die contacts") on the IC wafer. Conventional probe card assemblies include a printed circuit board, a substrate or probe head having a plurality of flexible test probes attached thereto, and an interposer that electrically connects the test probes to the printed circuit board. The interposer conventionally includes telescopic "pogo pins" or solder bumps that provide electrical connections between conductive pads on the printed circuit board and the interposer and between the interposer and conductive pads on the substrate. The test probes are conventionally mounted to electrically conductive, typically metallic, bonding pads on the substrate using solder attach, wire bonding or wedge bonding techniques.

In some applications, multiple test probes need to be applied to a single pad or bump to perform a test. For example, in RF or switching applications, two test probes that are electrically insulated from each other are needed to establish an RF current path. One test probe carries the RF forward signal and the other test probe carries the RF return signal, which is commonly referred to as a ground path if the ground is used as the return path. As another example, Kelvin connections use four probes. Two probes are used to apply a test signal and the other two probes are used to measure a voltage.

Using multiple conventional test probes to contact a single pad or bump has proven to be difficult for several reasons. Sometimes the test pad or bump presents an uneven surface that makes it difficult to maintain contact. For example, conventional test probes have a tendency to misalign or slip off bumps, causing an open circuit. Even if contact can be maintained, conventional test probes are relatively large compared to test pads and bumps. This requires that the conventional test probes be spaced apart and angled so that the tips can make contact with the test point. The distance between the probes, probe cross sectional area and probe length all have a direct effect on the inductance of the forward and reverse paths. A larger probe pitch, larger cross sectional area and longer probe length generally cause an increase in the path inductance, which is undesirable in RF or switching applications. Also, two test probes may exert different contact forces on a test point, which causes uneven tip wear and also uneven scrubbing on the test point. Conventional test probes are therefore generally not well suited for these types of applications. Based on the foregoing, there is a need for a test probe assembly that does not suffer from limitations of conventional test probes.

BRIEF DESCRIPTION OF THE DRAWINGS

In the figures of the accompanying drawings like reference numerals refer to similar elements.

DETAILED DESCRIPTION

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention. Various aspects of the invention are described hereinafter in the following sections:

I. OVERVIEW
II. DUAL TIP TEST PROBE FABRICATION
III. DUAL TIP TEST PROBE ASSEMBLY
IV. BENT TIP CONFIGURATIONS
V. OTHER DUAL TIP CONFIGURATIONS

I. Overview

A dual tip test probe assembly includes first and second elongated test probes, each having a body portion and a tip portion with a tip configured to make contact with a device under test. An electrically-insulating material is disposed between but not in contact with the body portions of the first and second elongated test probes to electrically isolate the first and second elongated test probes. The first and second elongated test probes are held in alignment with respect to each other so that the tip of the first elongated test probe is adjacent to and not in contact with the tip of the second elongated test probe for making simultaneous contact with the device under test.

The dual tip test probe assembly provides a low inductance relative to conventional test probes, making it well suited for RF and switching applications. The dual tip test probe assembly also provides a low and equal contact force and scrubbing action for the two probes and low tip wear. The assembly also provides a small, stable footprint, which is very beneficial for testing small and/or non-flat test points, such as bumps or ball contacts. The dual tip test probe assembly may be used in both cantilever and vertical probe applications.

II. Dual Tip Test Probe Fabrication

Figure 1:
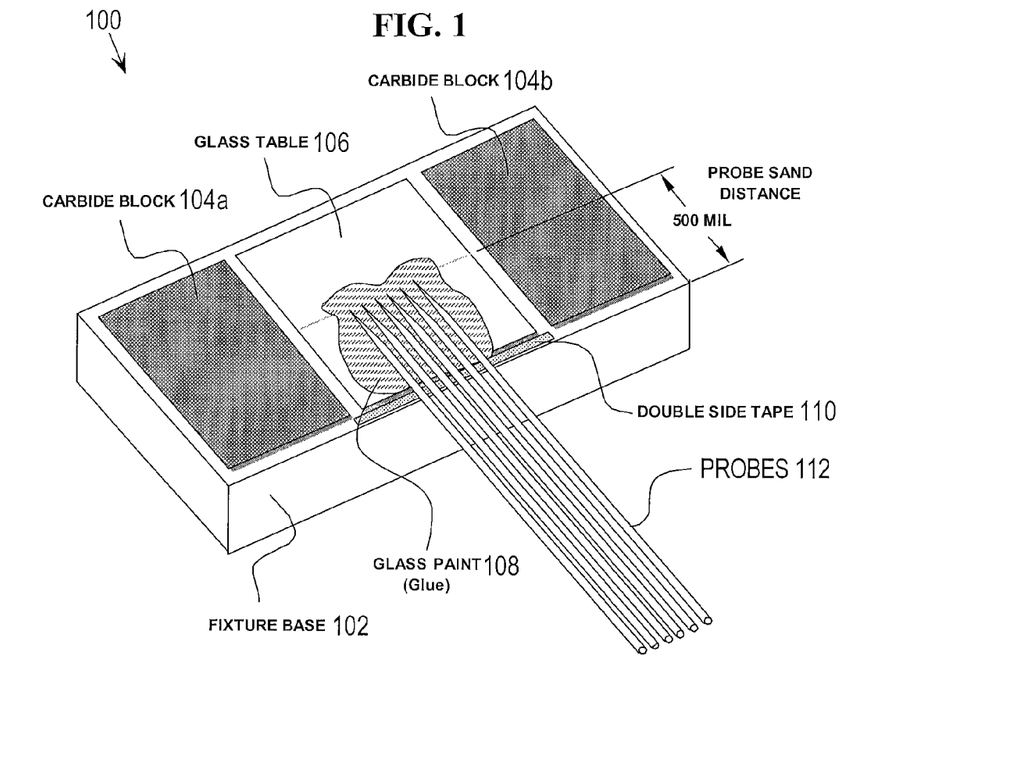
FIG. 1 depicts a top view of a probe fabrication fixture for fabricating probes for use in a dual tip test probe assembly according to one embodiment of the invention.
Figure 2:
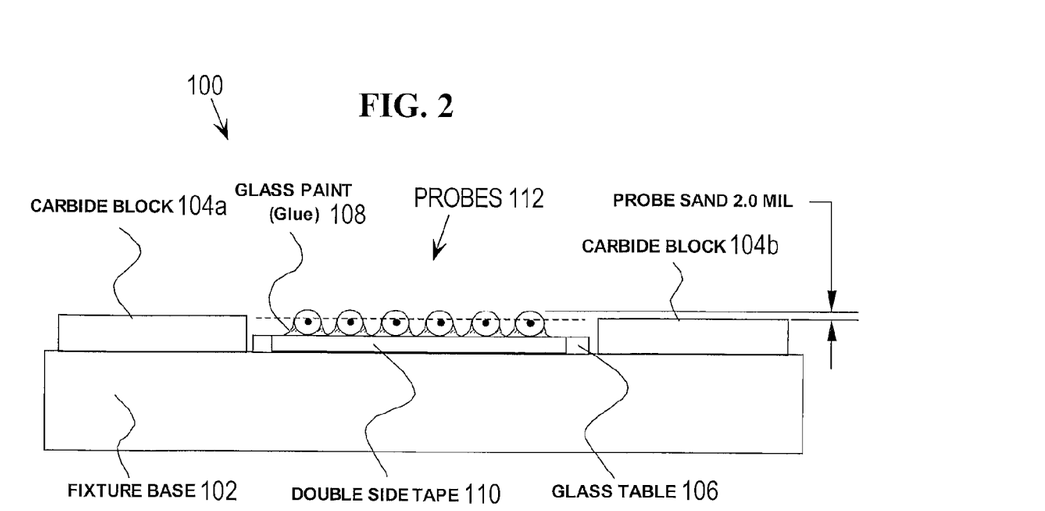
FIG. 2 depicts a side view of the probe fabrication fixture.

FIG. 1 depicts a top view of a probe fabrication fixture 100 for fabricating probes for use in a dual tip test probe assembly according to one embodiment of the invention. Fixture 100 includes a fixture base 102, carbide blocks 104a, 104b, a glass table 106, glass paint 108 and double-sided tape 110. FIG. 2 depicts a side view of the probe fabrication fixture 100.

For probe setup, the probes 112 are positioned on and aligned on the glass table 106. The probes 112 may be made from a wide variety of materials. Example materials include, without limitation, tungsten, tungsten rhenium, nickel, beryllium copper, molybdenum, silver, gold, copper, platinum, titanium and aluminum. The probes 112 may be made from multiple materials. For example, the tips of probes 112 may be coated with a material to provide improved wear characteristics. Tip portions of the probes 112 are secured to the glass table 106 via the glass paint glue 108. The probe fabrication fixture 100 is then baked, e.g., at 110 degrees Celsius for 30 minutes, and allowed to cool.

Figure 3:
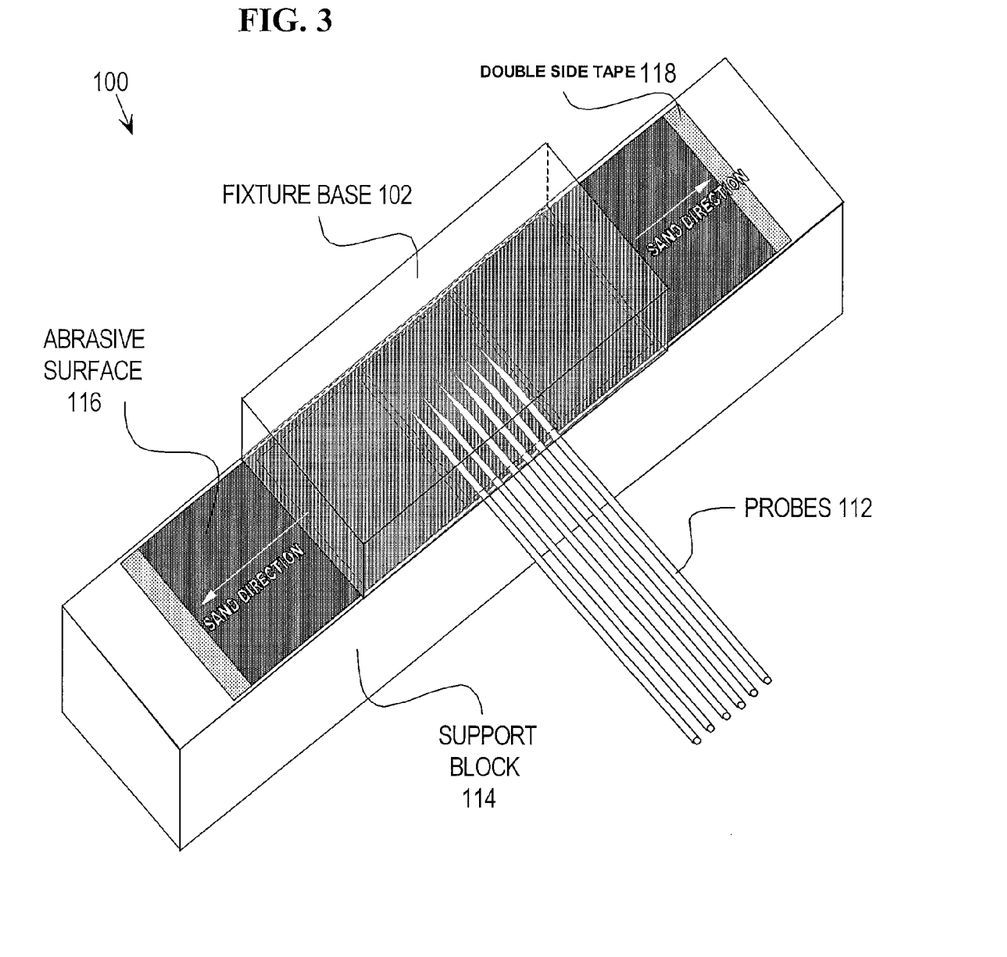
FIG. 3 depicts a probe fabrication fixture oriented upside down and placed onto a support block.

As depicted in FIG. 3, the probe fabrication fixture 100 is turned upside down and placed onto a support block 114, that may be, for example, a granite block. The support block 114 includes an abrasive surface 116. The abrasive surface 116 may be provided by sand paper, for example, mounted to the support block 114 via adhesive 118, such as glue or double-sided tape. Pressure is applied to the fabrication fixture 110 as it is moved side to side over the abrasive surface 116 on the support block 114. This creates a flat surface on one side of the probes 112. For example, as depicted in FIG. 2, approximately 2 mils of material is removed from one side of the probes 112. The amount removed from probes 112 may vary, depending upon a particular application, and the approach is not limited to removing any particular amount of material from probes 112. The probes 112 are removed from the fixture base 102 and cleaned to remove any excess adhesive.

Figure 4:
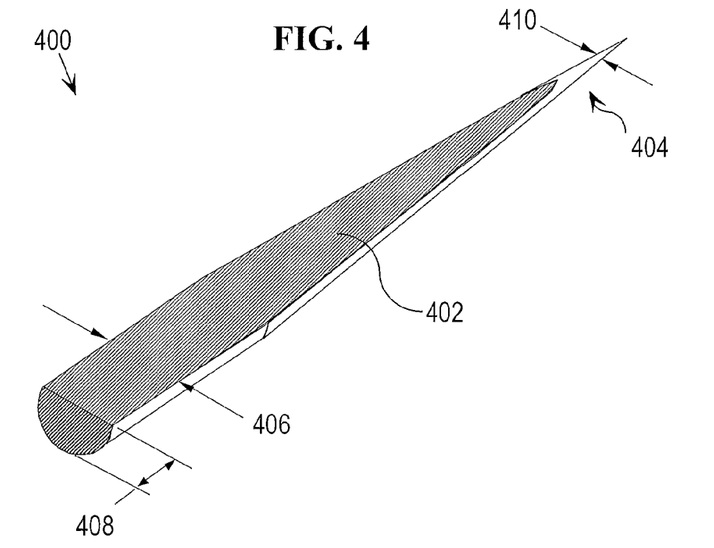
FIG. 4 depicts an example elongated test probe fabricated for use in a dual tip test probe assembly, according to one embodiment of the invention.

FIG. 4 depicts an example elongated test probe 400 fabricated for use in a dual tip test probe assembly, according to one embodiment of the invention. As depicted in FIG. 4, the elongated test probe 400 is generally semi-conical shaped and includes a flat surface 402 that is created during fabrication, as previously described herein. In this example, the flat surface 402 encompasses a majority of the elongated test probe 400, except at a tip portion 404, which does not have a flat surface because of the tapered diameter of the elongated test probe. The approach is applicable to a wide variety of sizes and shapes of elongated test probes. For purposes of explanation only, an example width 406 of a body portion of the elongated test probe 400 is about 4.9 mils and an example height 408 of the end of the body portion is about 3.0 mils. An example width 410 of a tip portion of the elongated test probe 400 is about 0.5 mils.

Figure 5:
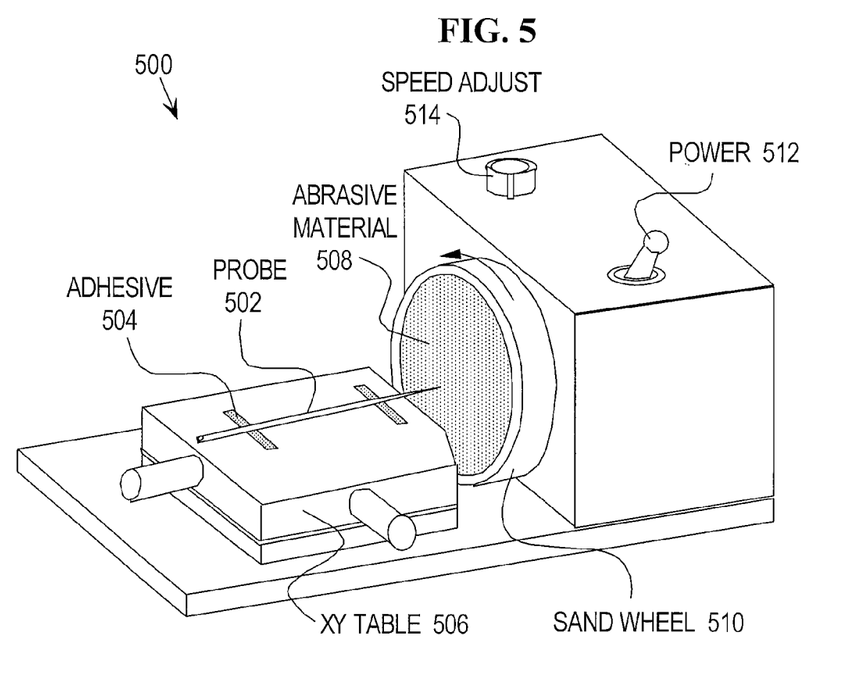
FIG. 5 depicts an example apparatus for forming a tip on an elongated test probe, according to one embodiment of the invention.

FIG. 5 depicts an example apparatus 500 for forming a tip on an elongated test probe, according to one embodiment of the invention. An elongated test probe 502 is mounted via an adhesive material 504, such as glue or double-sided tape, to an XY table 506, that enables the translation of the elongated test probe 502 in two axes. More specifically, the XY table 506 enables the elongated test probe 502 to be moved against an adhesive material 508, e.g., grit or sand paper, mounted on a sand wheel 510 that rotates. A power switch 512 applies power to a motor that causes the rotation of sand wheel 510. A speed adjust 514 allows the speed of the sand wheel 510 to be adjusted. According to one embodiment of the invention, a 3 um sand disk is attached to the sand wheel 510. The elongated test probe 502 is attached to the XY table 506 and the tip of the elongated test probe 502 is sanded to a specified diameter. An example tip diameter is 0.1-0.2 mils. The tip may be measured using a VCMM or microscope.

III. Dual Tip Probe Assembly

Once the individual elongated test probes are fabricated, then a dual tip test probe is assembled. In general, this involves aligning two elongated test probes so that their flat surfaces are adjacent and the corresponding tips are adjacent to but not in contact with each other. It also involves disposing an electrically insulating material between body portions of the elongated test probes so that the probes are electrically insulated from each other.

Figure 6A:
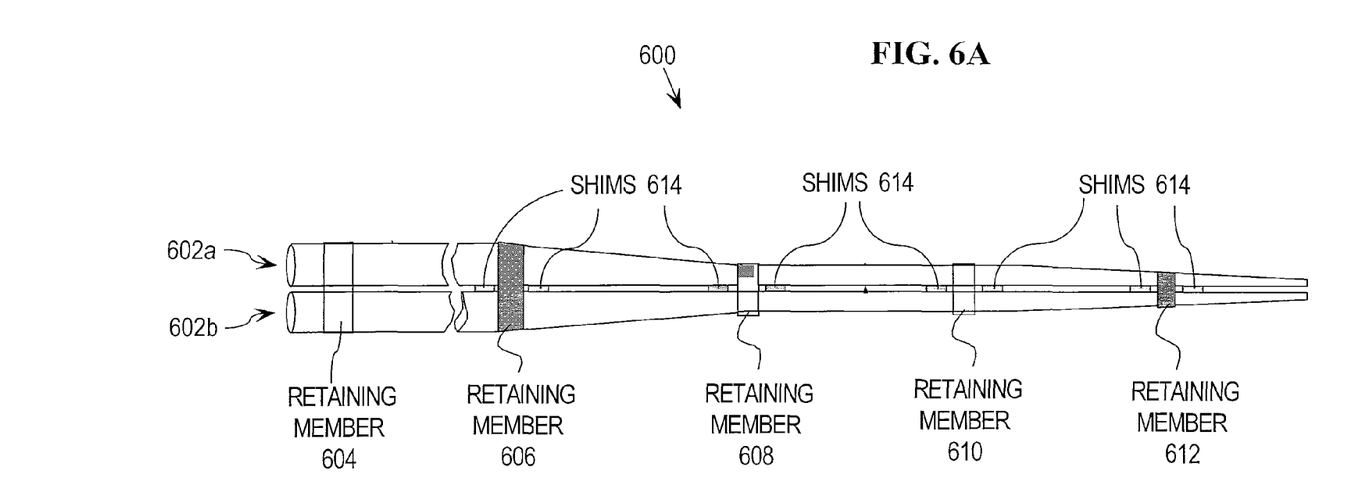
FIGS. 6A and 6B depict the assembly of a dual tip test probe, according to one embodiment of the invention.
Figure 6B:
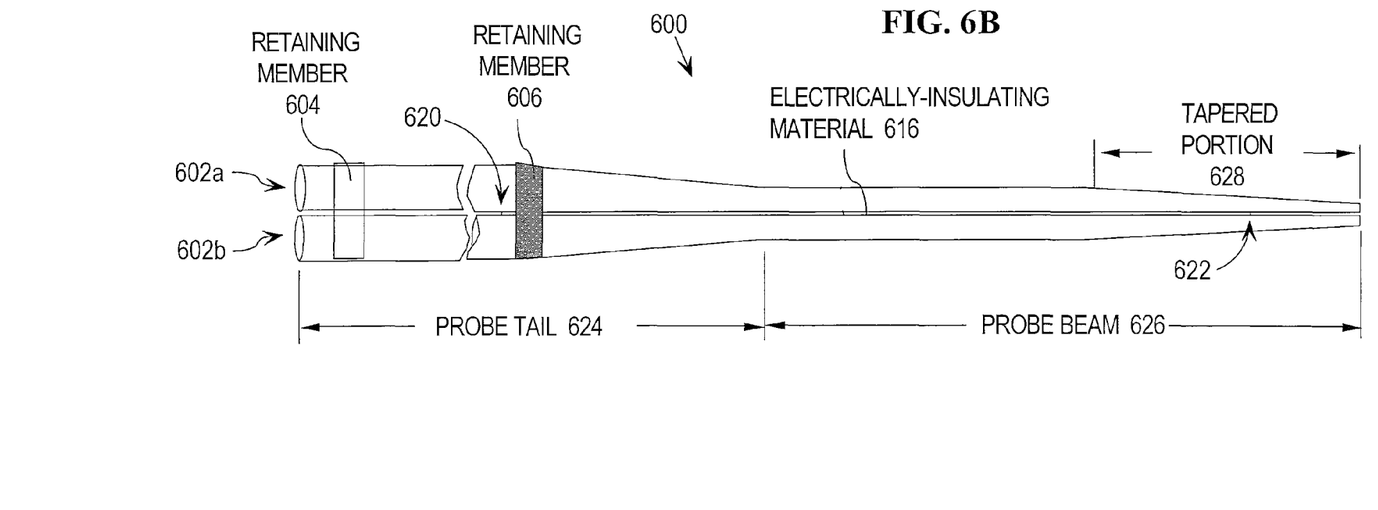

FIGS. 6A and 6B depict the assembly of a dual tip test probe 600, according to one embodiment of the invention. As depicted in FIG. 6A, two elongated test probes 602a, 602b are aligned with their flat surfaces facing each other and with the tips aligned. Retaining members 604-612 hold the elongated test probes 602a, 602b in position with respect to each other.

In FIG. 6A, the retaining members 604-612 are retaining rings, but any type of retaining member structure or shape may be used. For example, retaining blocks may be used. Retaining members 604-612 may be made from a wide variety of materials. Example materials include polyamide, plastic and rubber. Also, any number of retaining members may be used.

Shims 614 are inserted between the elongated test probes 602a, 602b to provide separation between the elongated test probes 602a, 602b. The shims 614 may be made from a wide variety of materials, depending upon a particular implementation. For example, non-conductive materials such as polyamides may be used for shims 614. The shims 614 may be a variety of sizes and shapes. One example shim is 0.5 mils thick.

As depicted in FIG. 6B, an electrically-insulating material 616 is disposed between the elongated test probes 602a, 602b to provide separation between the elongated test probes 602a, 602b. The electrically-insulating material 616 may be a wide variety of materials. Example electrically-insulating materials 616 include, without limitation, polyamide, plastic, rubber and silicone.

It is not necessary for the electrically-insulating material 616 to be disposed along the entire length of the elongated test probes 602a, 602b. For example, as depicted in FIG. 6B, the electrically-insulating material 616 is disposed along a portion of the elongated test probes 602a, 602b between points 620, 622. Although depicted in FIG. 6B as a contiguous section of material, the electrically-insulating material 616 may be disposed in sections between the elongated test probes 602a, 602b. Also, the electrically-insulating material 616 is not disposed near the tips to allow the tips to deflect.

Once the electrically-insulating material 616 has been disposed between the elongated test probes 602a, 602b, the assembly 600 may be baked, e.g., at 110 degrees Celsius for 30 minutes, and then allowed to cool. Any excess electrically-insulating material 616 is removed and as depicted in FIG. 6B, one or more of the retaining members 604-612 may be removed. In the present example, retaining members 604, 606 remain in place. The electrically-insulating material 616 may be applied to the assembly 600 using a wide variety of techniques. For example, polyamide liquid may be applied onto a small needle tip and dropped on elongated test probes 602a, 602b to fill in the gap between elongated test probes 602a, 602b. The elongated test probes 602a, 602b may then be cured, for example, in an oven for 30 minutes at 110 degrees Celsius. One or more of the shims 614 may be left between the elongated test probes 602a, 602b after the electrically-insulating material 616 is applied. Alternatively, the shims 614 may be removed.

In the example depicted in FIGS. 6A and 6B, the elongated test probes 602a, 602b may each be about 5 mils in diameter at the largest point, e.g., near retaining member 604, about 3 mils thick in the middle, near retaining members 608, 610, where the flat surface is located, and about 0.25 mils thick at the tip, to the right of retaining member 612. As depicted in FIG. 6B, each elongated test probe 602a, 602b includes a probe tail portion 624, a probe beam portion 626 and a tapered portion 628. Example dimensions for these portions are about 2.5 inches for the probe tail portion 624, about 500 mils for probe beam portion 626 and about 50 to about 60 mils for tapered portion 628. These are example sizes and a wide variety of sizes may be used, depending upon the requirements of a particular application.

IV. Bent Tip Configurations

Figure 7A:
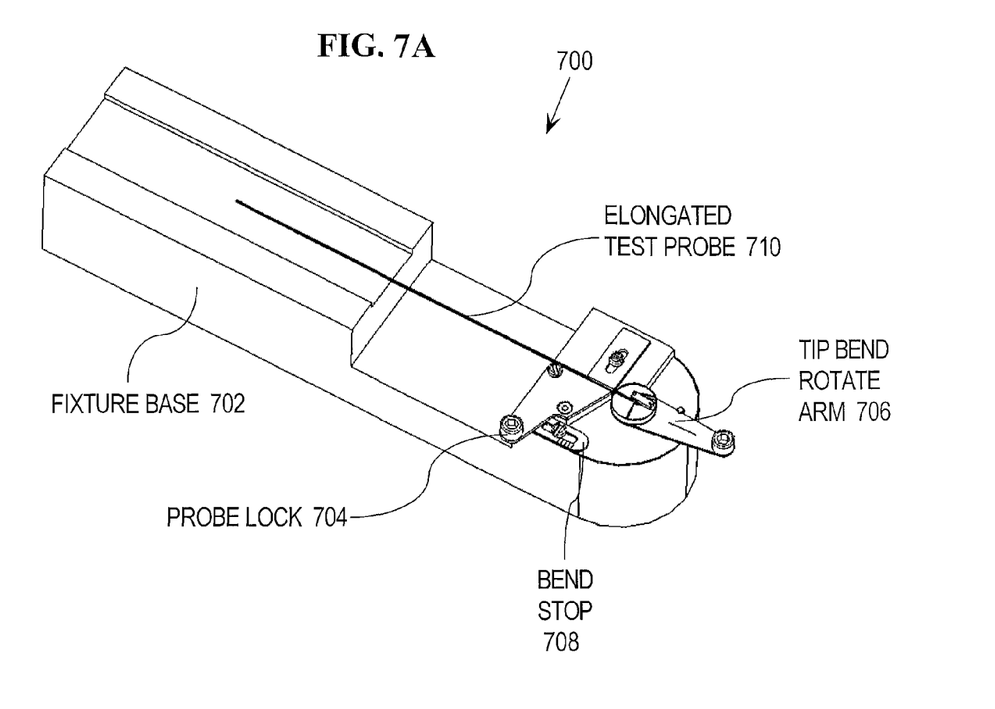
FIG. 7A is a block diagram that depicts an assembly for creating a dual tip test probe with a bent tip.

In some situations it is desirable for test probes to have bent tips, for example in cantilever probe applications. According to one embodiment of the invention, a dual tip test probe assembly may be created with bent tips. FIG. 7A is a block diagram that depicts an assembly 700 for creating a dual tip test probe with a bent tip. Assembly 700 includes a fixture base 702, a probe lock 704, a tip bend rotate arm 706 and a bend stop 708. Elongated test probes 710 are placed onto the fixture based 702 and held in place by the probe lock 704. The bend stop 708 provides an adjustment to the bend angle.

Figure 7B:
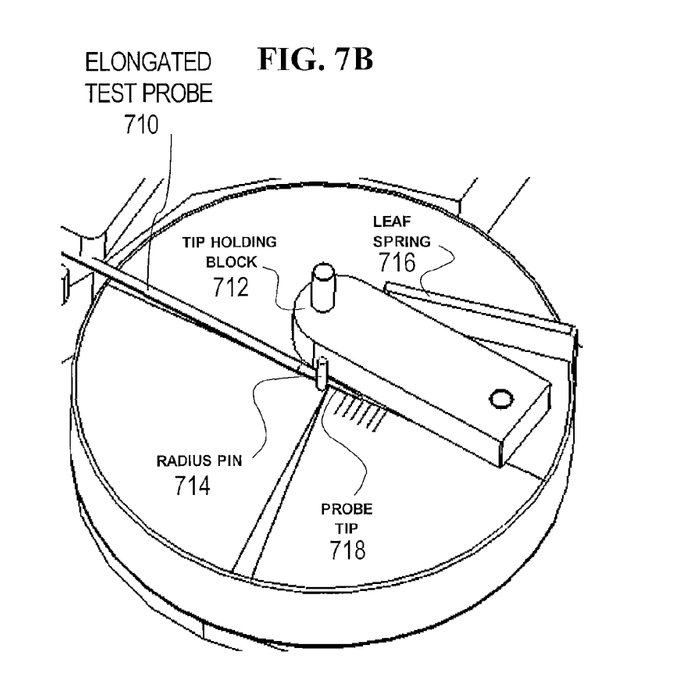
FIG. 7B depicts a close-up view of a portion of assembly for creating a dual tip test probe with a bent tip.
Figure 7C:
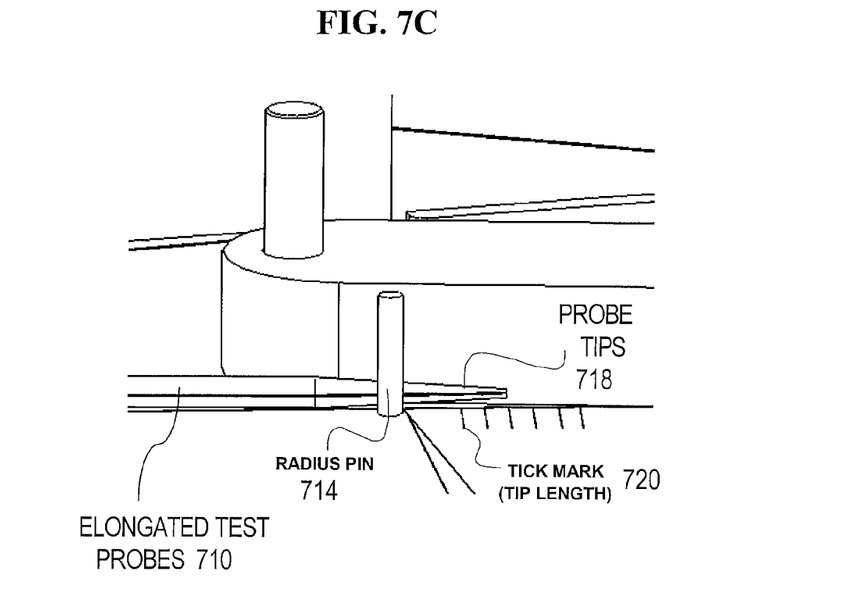
FIG. 7C depicts an elongated test probe positioned with respect to radius pin so that the probe tip is at a desired location relative to a tick mark.
Figure 7D:
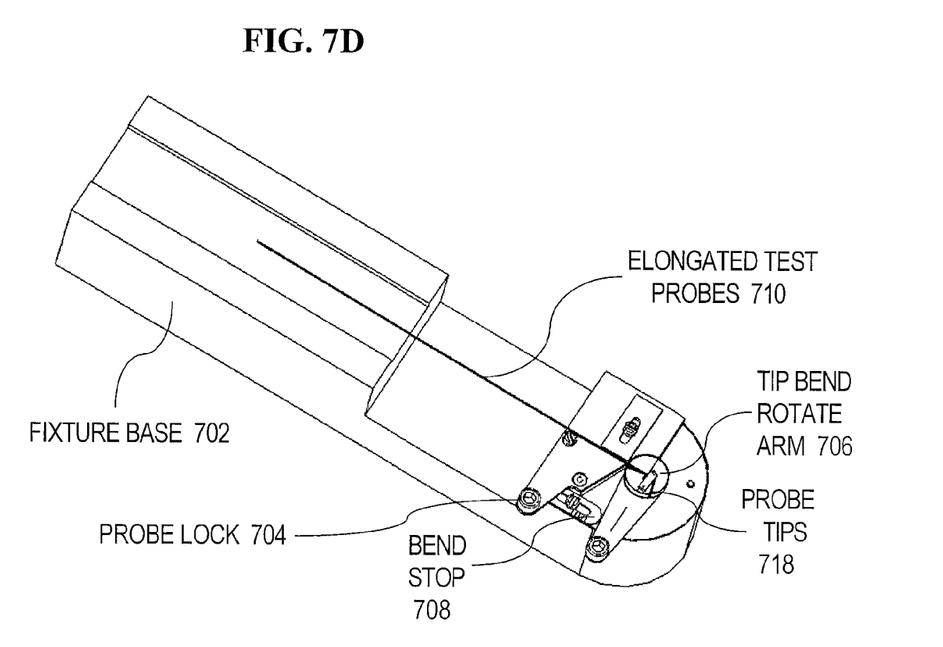
FIG. 7D depicts the assembly for creating a dual tip test probe with a bent tip after the tip bend rotate arm has been rotated to bend the probe tip to a desired angle.

FIG. 7B depicts a close-up view of a portion of assembly 700. Elongated test probes 710 are held by a tip holding block 712 against a radius pin 714. A leaf spring 716 applies a force to the tip holding block 712 to hold a probe tip 718 of the elongated test probes 710 against the radius pin 714. FIG. 7C depicts the elongated test probes 710 positioned with respect to radius pin 714 so that the probe tip 718 is at a desired location relative to a tick mark 720. FIG. 7D depicts the assembly 700 after the tip bend rotate arm 706 has been rotated to bend the probe tip 718 to a desired angle.

Figure 8:
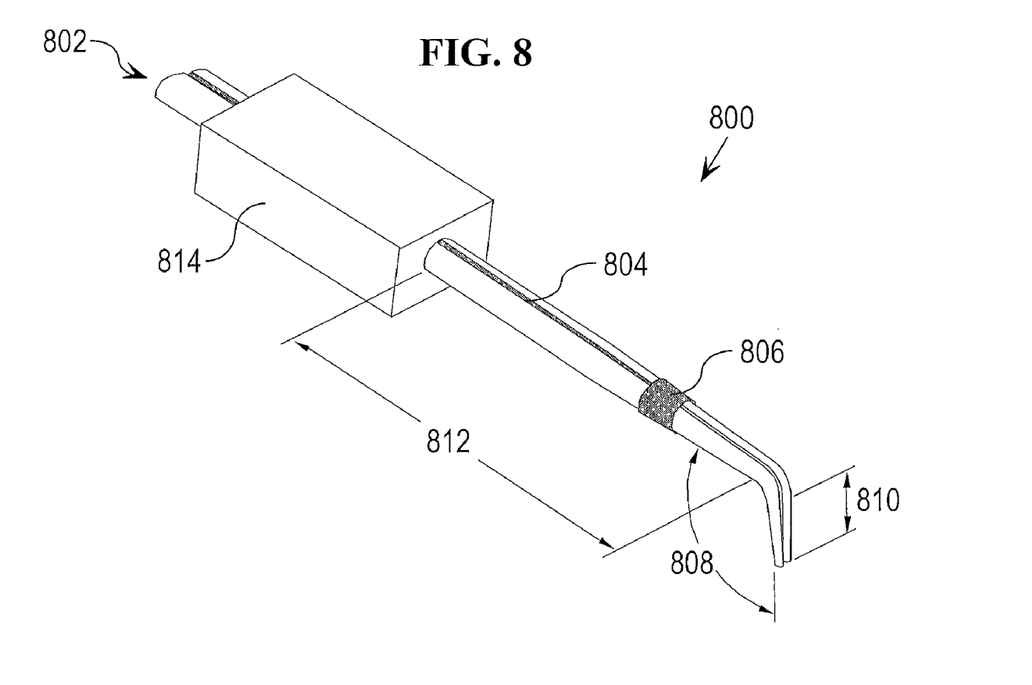
FIG. 8 depicts an example dual tip test probe assembly that includes two elongated test probes with an electrically-insulating material disposed between and in contact with the two elongated test probes.

FIG. 8 depicts an example dual tip test probe assembly 800 that includes two elongated test probes 802 with an electrically-insulating material disposed between and in contact with the two elongated test probes 802. A retaining member 806 holds the two elongated test probes 802 together. The tips of the two elongated test probes 802 are bent as described herein. According to one embodiment of the invention, the tips are bent at an angle 808 of about 103 degrees, although various other angles may be used. In this example, the tip length 810 is about 8 mils and the beam length 812 is about 110 mils. The assembly 800 also includes a base portion 814 that may be made, for example, from epoxy.

V. Other Dual Tip Configurations

Figure 9A:
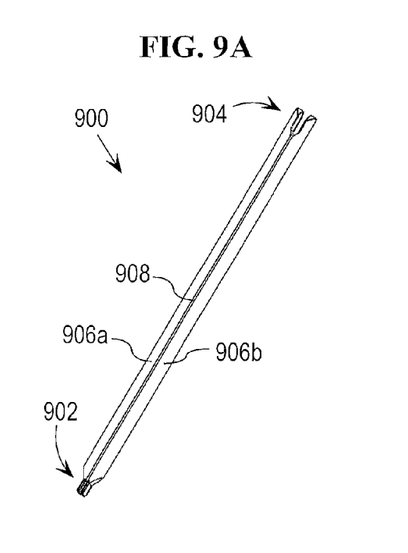
FIGS. 9A-9C depict an example dual tip test probe assembly for vertical probe applications for bump testing.
Figure 9B:
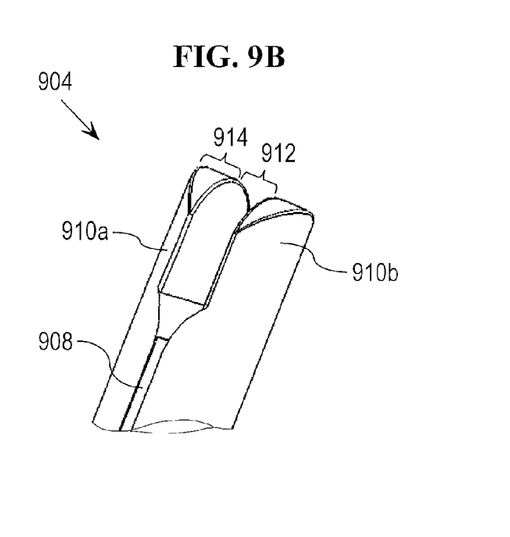
Figure 9C:
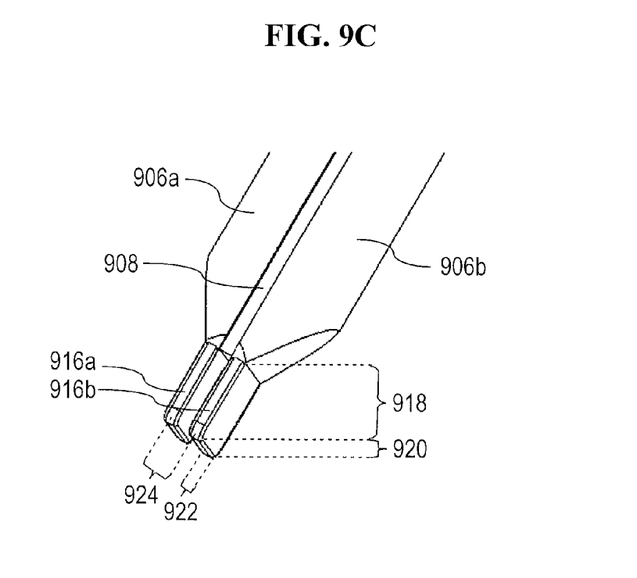

A wide variety of dual tip configurations may be used, depending upon a particular implementation. For example, FIGS. 9A-9C depict an example dual tip test probe assembly 900 for vertical probe applications for bump testing. As depicted in FIG. 9A, the dual tip test probe assembly 900 includes a tip portion 902 and a tail portion 904. An example length of the dual tip test probe assembly 900 is about 1 inch with a body diameter of about 6.5 mils. The dual tip test probe assembly 900 includes elongated test probes 906a, 906b and an electrically-insulating material 908 disposed between the elongated test probes 906a, 906b.

FIG. 9B depicts a close-up view of the tail portion 904 of the dual tip test probe assembly 900. The tail portion 904 includes tail portions 910a, 910b that correspond to the two elongated test probes 906a, 906b in the dual tip test probe assembly 900. As depicted in FIG. 9B, the dual tip test probe assembly 900 may include a gap 910 between the tails 910a, 910b. An example dimension of the gap 912 is about 2.5 mils. An example end thickness 914 of each tail portion 910a, 910b is about 2 mils. The shape and dimensions of tail portions 910a, 910b may vary depending upon the particular electrical connectors or contacts being used in a particular application.

FIG. 9C depicts a close-up view of the tip portion 902 of the dual tip test probe assembly 900. The tip portion 902 includes tips 916a, 916b that correspond to the elongated test probes 906a, 906b. In this example, the tips 916a, 916b are generally rectangular in shape. In this example, the electrically-insulating material 908 is not disposed between the tips 916a, 916b to allow good contact with a bump. Example dimensions of the tips 906a, 906b are length of about 3 mils, height of about 4.5 mils and a width of about 0.5 mils. In this example, there is also a space 924 between the tips 916a, 916b of about 1 mil, measured from center-to-center of the tips 916a, 916b.

Figure 10A:
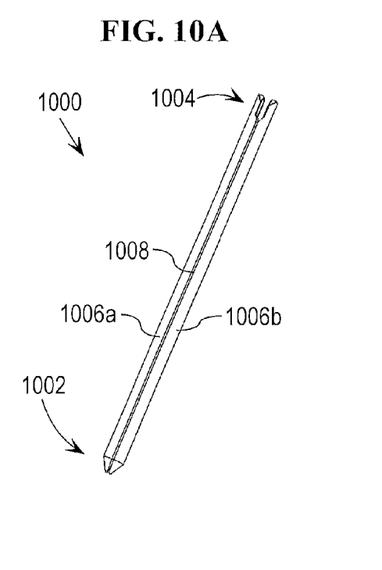
FIGS. 10A-10C depict an example dual tip test probe assembly for vertical probe applications for die pad testing.
Figure 10B:
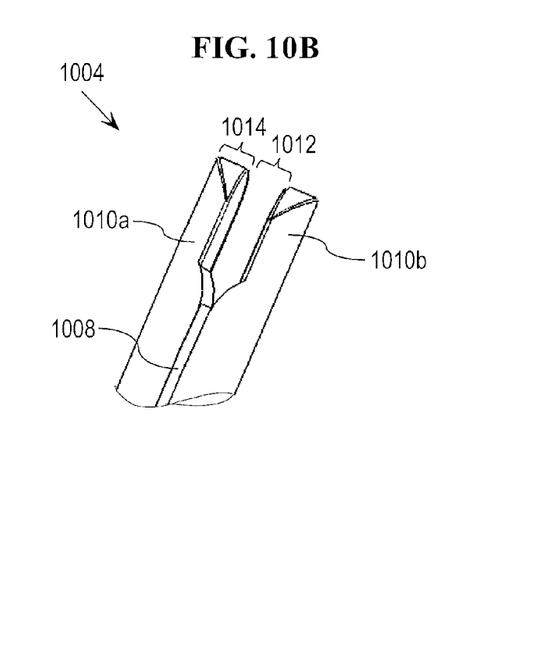
Figure 10C:
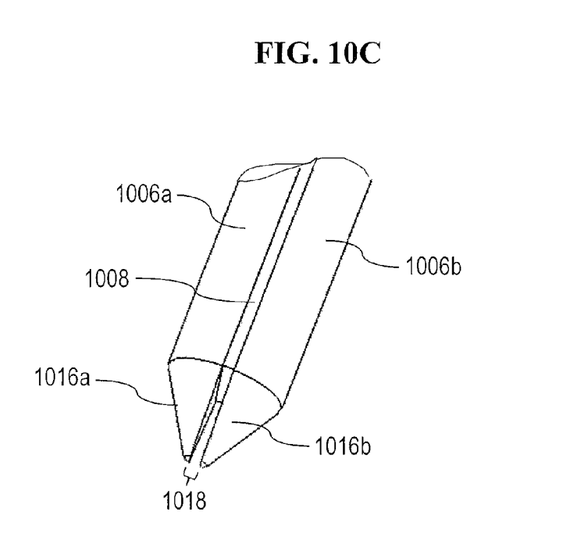

As another example, FIGS. 10A-10C depict an example dual tip test probe assembly 1000 for vertical probe applications for die pad testing. As depicted in FIG. 10A, the dual tip test probe assembly 1000 includes a tip portion 1002 and a tail portion 1004. An example length of the dual tip test probe assembly is about 1 inch with a body diameter of about 6.5 mils. The dual tip test probe assembly 1000 includes elongated test probes 1006a, 1006b and an electrically-insulating material 1008 disposed between the elongated test probes 1006a, 1006b.

FIG. 10B depicts a close-up view of the tail portion 1004 of the dual tip test probe assembly 1000. The tail portion 1004 includes tail portions 1010a, 1010b that correspond to the two elongated test probes 1006a, 1006b in the dual tip test probe assembly 1000. As depicted in FIG. 10B, the dual tip test probe assembly 1000 may include a gap 1010 between the tails 1010a, 1010b. An example dimension of the gap 1012 is about 2.5 mils. An example end thickness 1014 of each tail portion 1010a, 1010b is about 2 mils.

FIG. 10C depicts a close-up view of the tip portion 1002 of the dual tip test probe assembly 1000. The tip portion 1002 includes tips 1016a, 1016b that correspond to the elongated test probes 1006a, 1006b. In this example, the tips 1016a, 1016b are generally semi-conical in shape. In this example, the electrically-insulating material 1008 is not disposed between the tips 1016a, 1016b to allow good contact with a die pad. An example gap 1018 between the tips 1006a, 1006b is about 0.75 mils.

Figure 11A:
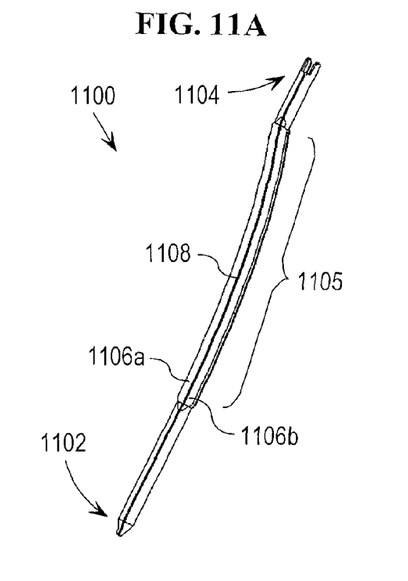
FIGS. 11A-11C depict another example dual tip test probe assembly for vertical probe applications for die pad testing.
Figure 11B:
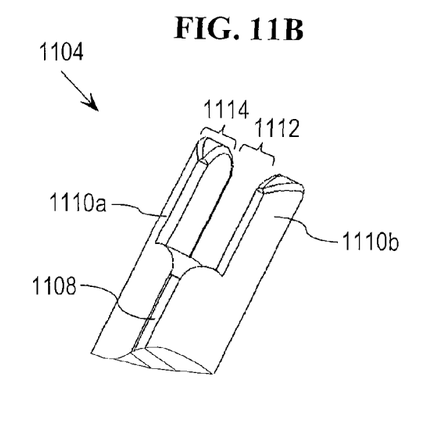
Figure 11C:
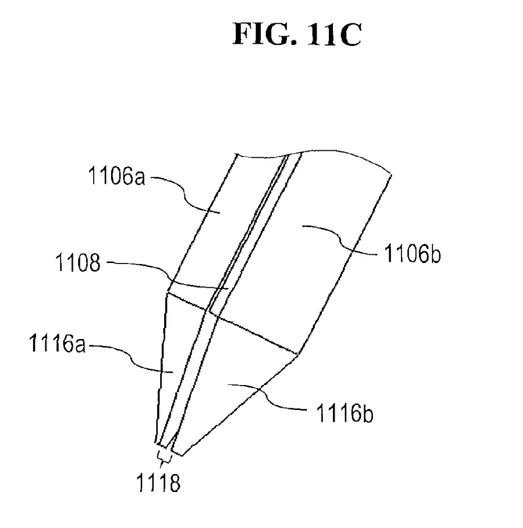

As a further example, FIGS. 11A-11C depict another example dual tip test probe assembly 1100 for vertical probe applications for die pad testing. As depicted in FIG. 11A, the dual tip test probe assembly 1100 includes a tip portion 1102 and a tail portion 1104 and a body portion 1105. An example length of the dual tip test probe assembly is about 1 inch with a body diameter of about 6.5 mils. The dual tip test probe assembly 1100 includes elongated test probes 1106a, 1106b and an electrically-insulating material 1108 disposed between the elongated test probes 1106a, 1106b. In this example, the body portion 1105 of each elongated test probe 1106a, 1106b is curved. This causes the elongated test probes 1106a, 1106b to bend in the same direction when contact is made with a test point.

FIG. 11B depicts a close-up view of the tail portion 1104 of the dual tip test probe assembly 1100. The tail portion 1104 includes tail portions 1110a, 1110b that correspond to the two elongated test probes 1106a, 1106b in the dual tip test probe assembly 1100. As depicted in FIG. 11B, the dual tip test probe assembly 1100 may include a gap 1110 between the tails 1110a, 1110b. An example dimension of the gap 1112 is about 2.5 mils. An example end thickness 1114 of each tail portion 1110a, 1110b is about 1.5 mils. An example thickness of the electrically-insulating layer 1108 is about 0.5 mils.

FIG. 11C depicts a close-up view of the tip portion 1102 of the dual tip test probe assembly 1100. The tip portion 1102 includes tips 1116a, 1116b that correspond to the elongated test probes 1106a, 1106b. In this example, the tips 1116a, 1116b are generally semi-conical in shape. In this example, the electrically-insulating material 1108 is not disposed between the tips 1116a, 1116b to allow good contact with a die pad. An example gap 1118 between the tips 1106a, 1106b is about 0.75 mils.

In the foregoing specification, embodiments of the invention have been described with reference to numerous specific details that may vary from implementation to implementation. Thus, the sole and exclusive indicator of what is, and is intended by the applicants to be, the invention is the set of claims that issue from this application, in the specific form in which such claims issue, including any subsequent correction. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A test probe assembly comprising:
   a first elongated test probe having at least a curved body portion and a tip portion with a tip configured to make contact with a device under test;
   a second elongated test probe having at least a curved body portion and a tip portion with a tip configured to make contact with the device under test; and
   an electrically-insulating material disposed between and in contact with the curved body portion of the first elongated test probe and the curved body portion of the second elongated test probe to electrically insulate the first elongated test probe from the second elongated test probe,
   wherein the first elongated test probe and the second elongated test probe are held in alignment with respect to each other so that the curved body portion of the first elongated test probe is aligned in the same direction as the curved body portion of the second elongated test probe and so that the tip of the first elongated test probe is adjacent to but not in contact with the tip of the second elongated test probe for making simultaneous contact with the device under test.

2. The test probe assembly as recited in claim 1, wherein:
   the curved body portion of the first elongated test probe includes a flat surface,
   the curved body portion of the second elongated test probe includes a flat surface, and
   the electrically-insulating material is disposed between and in contact with the flat surface of the curved body portion of the first elongated test probe and the flat surface of the curved body portion of the second elongated test probe.

3. The test probe assembly as recited in claim 2, wherein:
   the curved body portion of the first elongated test probe at the flat surface is generally semicircular in shape, and
   the curved body portion of the second elongated test probe at the flat surface is generally semicircular in shape.

4. The test probe assembly as recited in claim 1, wherein both the tip portion of the first elongated test probe and the tip portion of the second elongated test probe are tapered.

5. The test probe assembly as recited in claim 1, wherein the tip of the first elongated test probe and the tip of second elongated test probe are rectangular in shape.

6. The test probe assembly as recited in claim 1, wherein the tip of the first elongated test probe and the tip of second elongated test probe are semiconical in shape.

7. The test probe assembly as recited in claim 1, wherein the tip portion of the first elongated test probe and the tip portion of second elongated test probe are both bent for cantilever probe applications.

8. The test probe assembly as recited in claim 1, wherein:
   the first elongated test probe includes a first end and a second end,
   the tip portion of the first elongated test probe is at the first end of the first elongated test probe,
   the first elongated test probe includes a tail portion at the second end of the first elongated test probe,
   the second elongated test probe includes a first end and a second end,
   the tip portion of the second elongated test probe is at the first end of the second elongated test probe,
   the second elongated test probe includes a tail portion at the second end of the second elongated test probe, and
   the second end of the first elongated test probe and the second end of the second elongated test probe are shaped so that a distance between the tail portion of the second end of the first elongated test probe and the tail portion of the second end of the second elongated test probe is greater than a distance between the curved body portion of the first elongated test probe and the curved body portion of the second elongated test probe.

9. The test probe assembly as recited in claim 1, further comprising one or more retaining members configured to hold the first and second elongated test probes in position with respect to each other.

10. The test probe assembly as recited in claim 9, wherein the one or more retaining members are one or more retaining rings around the first and second elongated test probes.

11. The test probe assembly as recited in claim 8, wherein a cross sectional area of the tail portion of the second end of the first elongated test probe is less than a cross sectional area of the curved body portion of the first elongated test probe and a cross sectional area of the tail portion of the second end of the second elongated test probe is less than a cross sectional area of the curved body portion of the second elongated test probe.

12. The test probe assembly as recited in claim 8, wherein the electrically-insulating material is not disposed between the tail portion of the second end of the first elongated test probe and the tail portion of the second end of the second elongated test probe.

13. The test probe assembly as recited in claim 1, wherein the electrically-insulating material is a polyamide material.

14. The test probe assembly as recited in claim 1, wherein the electrically-insulating material is not disposed in between the tip portion of the first elongated test probe and the tip portion of the second elongated test probe.

15. The test probe assembly as recited in claim 1, further comprising one or more shims disposed between the first elongated test probe and the second elongated test probe.

* * * * *